United States Patent
Tilton et al.

[11] Patent Number: 6,016,969
[45] Date of Patent: Jan. 25, 2000

[54] LAMINATED ARRAY OF PRESSURE SWIRL ATOMIZERS

[76] Inventors: Charles Tilton, 500 Steptoe St.; Donald E Tilton, 14402 SR 195, both of Colton, Wash. 99113

[21] Appl. No.: 09/151,247

[22] Filed: Sep. 14, 1998

Related U.S. Application Data

[62] Division of application No. 08/758,746, Dec. 6, 1996, Pat. No. 5,860,602.

[51] Int. Cl.[7] ...................................................... B05B 1/34
[52] U.S. Cl. ................................ 239/1; 239/11; 239/461; 239/466; 239/494; 239/548; 239/555
[58] Field of Search ................................. 239/1, 11, 461, 239/463, 466, 491, 494, 554, 555, 548

[56] References Cited

U.S. PATENT DOCUMENTS

| | | | |
|---|---|---|---|
| 1,869,809 | 8/1932 | Hewlett | 239/494 |
| 2,378,348 | 6/1945 | Wilmes | 239/491 |
| 2,593,884 | 4/1952 | Ifield | 239/494 |
| 3,692,245 | 9/1972 | Needham et al. | 239/488 |
| 4,087,050 | 5/1978 | Tsuji et al. | 239/490 |
| 5,220,804 | 6/1993 | Tilton et al. | 62/64 |
| 5,435,884 | 7/1995 | Simmons et al. | 216/100 |
| 5,547,094 | 8/1996 | Bartels et al. | 216/33 |
| 5,553,789 | 9/1996 | Findler et al. | 239/548 |
| 5,622,489 | 4/1997 | Monro | 431/187 |
| 5,740,967 | 4/1998 | Simmons et al. | 239/494 |

FOREIGN PATENT DOCUMENTS

| | | | |
|---|---|---|---|
| 60190593 | 9/1994 | Japan | 239/555 |

*Primary Examiner*—Andres Kashnikow
*Assistant Examiner*—Robin O. Evans
*Attorney, Agent, or Firm*—David S. Thompson

[57] ABSTRACT

A laminated array of pressure swirl atomizers forms spray plate that produces a fine mist or spray of liquid. The atomizers may be arrayed in a custom manner that may be made application specific for greater efficiency. The spray plate is typically formed of a plurality of laminated plates. In a preferred embodiment, a plate adjacent to a fluid reservoir provides an array of aperture sets, each aperture set having two or three apertures that allow liquid to pass from the pressurized reservoir through the first layer. The second plate provides a corresponding array of swirlers, each swirler providing at least two swirl feed ports to tangentially project liquid into the swirl chambers contained in a third plate. A fourth plate provides a corresponding array of discharge apertures, which release the liquid in an atomized state.

5 Claims, 9 Drawing Sheets

LAMINATED ARRAY OF PRESSURE SWIRL ATOMIZERS

CROSS-REFERENCES

This application is related to application Ser. No. 08/638, 985 filed Apr. 26, 1996, now U.S. Pat. No. 5,719,444, and is a divisional of application Ser. No. 08/758,746, filed Dec. 6, 1996 now U.S. Pat. No. .5,860,602

BACKGROUND

Advances in electronic component and circuit board design have in many respects out-paced advances in electronic cooling technology. However, the development of spray cooling technology can provide an alternative to the more common use of fans and forced air convection cooling. Spray cooling technology is capable of removing heat more rapidly than air-cooling technology, in part because of the heat absorbed by the coolant during the phase-change. Spray cooling technology is made more efficient by atomizers which are designed and configured to maximize the heat transfer effectiveness and surface area of the coolant.

Unfortunately, atomizer technology has failed to produce atomizers having a structure that is suited to economical production of the large numbers of atomizers needed to most efficiently cool electronic components or other heat producing devices. Large numbers of atomizers, each producing large numbers of droplets having extremely small diameters, are required for most efficient cooling. A smaller number of larger atomizers would, as a result of their geometry, produce larger droplets having a correspondingly lower evaporation rate and lower cooling effectiveness.

A known type of atomizer is formed from a two-layer laminate that is inserted into discrete supporting members which can be press-fit or threaded into a housing, plate or further supporting member. The two-layer laminate may be formed by chemically etching from both sides of each layer, thereby forming swirlers with associated swirl feed ports and a discharge aperture.

Such atomizers are not well suited for mass production due to the requirement of a discrete supporting member associated with each atomizer. Additionally, there is the cost of inserting the atomizer into the discrete supporting member and the cost of inserting the discrete supporting member into some further supporting member by press-fit, threading or other means.

A further problem inherent with the structures used to manufacture known atomizers, and the manufacturing processes, is the inability to control the dimensions of the component elements of the atomizer precisely enough to allow the development of design rules to control the trajectory and distribution of the spray output.

What is needed, therefore, is an atomizer having structural characteristics that obviates the need to provide each atomizer with a discrete supporting member, and therefore which does not require that the discrete supporting member be attached to a further supporting structure. A further need is for an atomizer having structural characteristics that better supports very tight control over the geometric dimensions and relationships of the component parts of individual atomizers, thereby allowing better control over the discharged spray.

SUMMARY

The present invention is directed to a laminated array of pressure swirl atomizers. The array is customizable, in that atomizers may be distributed in a regular or irregular pattern and of varying design characteristics, as is appropriate for the specific application. The arrays are constructed of thin, laminated layers containing the functional constituents of the atomizers.

Several methods of constructing a laminated spray plate having an array of pressure swirl atomizers are disclosed, a preferred method includes combining the following:

(a) A fluid chamber, or plenum.

(b) A first plate, having an array of aperture sets, adjacent to the plenum. Each aperture set provides at least a first and a second swirl inlet, and optionally a center jet.

(c) A second plate, adjacent to the first plate, the second plate having a swirler having a first and a second swirl feed port and a central circular chamber associated with each aperture set of the first plate, wherein the first and second swirl feed ports are adjacent to the first and second swirl inlets of an associated aperture set of the first plate.

(d) A third plate, adjacent to the second plate, the third plate having a swirl chamber associated with each swirler of the second plate, wherein the swirl chamber is adjacent to the central circular chamber the swirler.

(e) A fourth plate, adjacent to the third plate, the fourth plate having a discharge aperture associated with each swirl chamber of the third plate, wherein the discharge aperture is adjacent to the associated swirl chamber.

The spray plate may additionally involve a method of regulating the relative sizes and shapes of the functional constituents of the atomizers, and thereby controlling the spray pattern characteristics of individual atomizers. The method includes steps such as varying the size of the center jet of the aperture set of the first plate with respect to the discharge aperture of the fourth plate, thereby controlling the cone angle of the discharged spray.

An advantage of the present invention is to provide a laminated array of pressure swirl atomizers for cooling electronic components or other applications that is customizable for any given application, in that an array of atomizers may be produced that puts the atomizers where they are most needed, thereby substantially improving cooling efficiency.

Another advantage of the present invention is to provide an atomizer array which because of its fabrication method permits easy modification of the functional constituents of the atomizers, by means of a set of design rules, to create the spray pattern characteristics in each atomizer that are best suited to a specific application.

A still further advantage of the present invention is to provide a method of producing a large number of atomizers having excellent atomizing characteristics, custom locations and custom spray characteristics at an extremely low cost.

DRAWINGS

These and other features, aspects, and advantages of the present invention will become better understood with regard to the following description, appended claims, and accompanying drawings where:

DESCRIPTION

Figure 1:
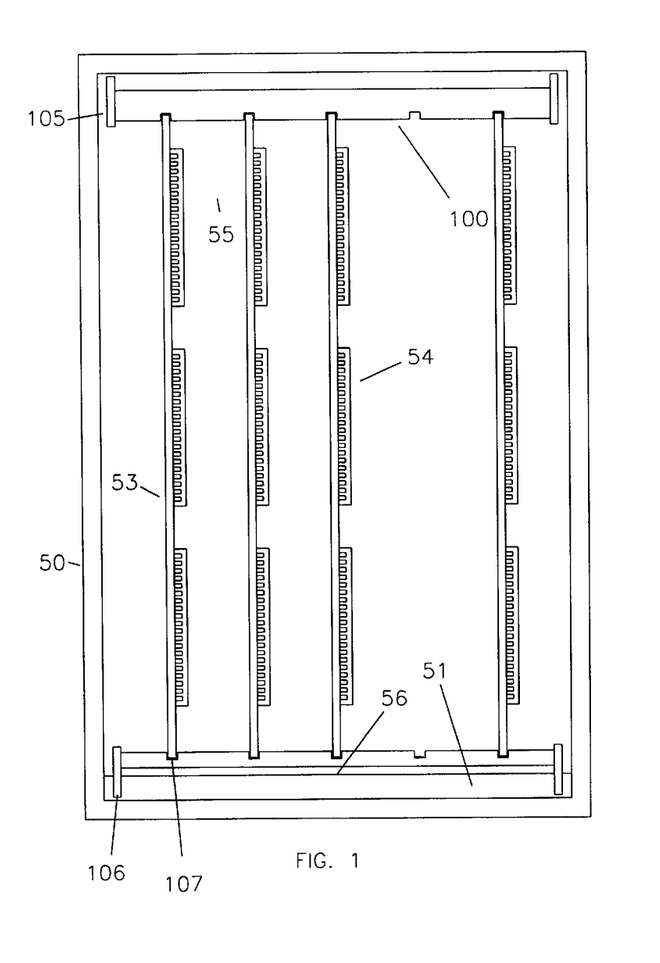
FIG. 1 is an side view of a housing containing a plurality of electronic component cards and a side view of a version of the laminated pressure swirl atomizer array of the invention.
Figure 2:
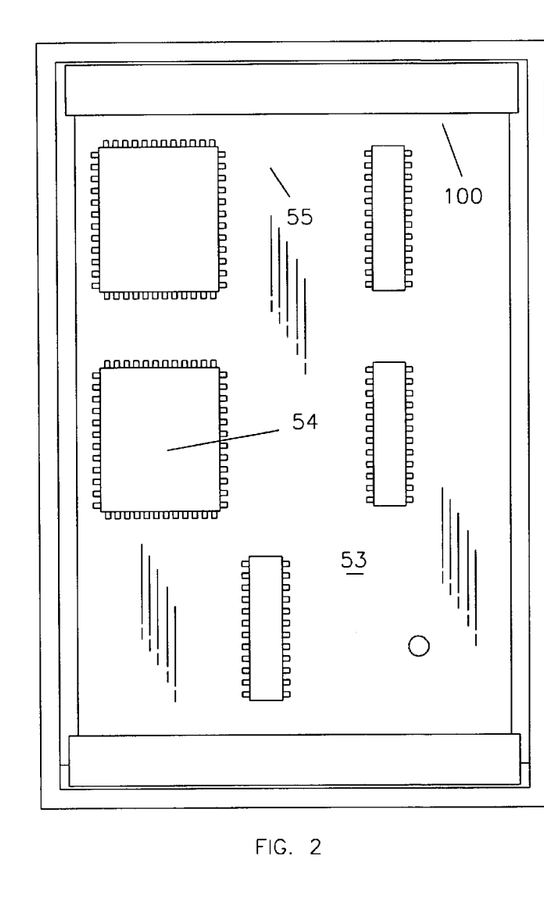
FIG. 2 is a front view of the housing of FIG. 1, showing one electronic component card and a second side view orthogonal to that of FIG. 1 of the laminated pressure swirl atomizer array of FIG. 1.
Figure 3:
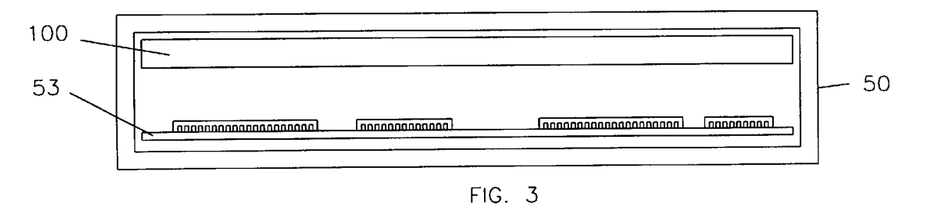
FIG. 3 is a side view of a housing containing a single electronic component card having a laminated spray plate that is parallel to the component card.

Referring to the figures, several versions of a spray plate 100 providing an array of pressure swirl atomizers 102 constructed according to the principles of the invention are seen. As seen in FIGS. 1 and 2, the spray plate may be oriented perpendicularly to a plurality of electronics printed circuit cards 53. Alternatively, as seen in FIG. 3, the spray plate may be oriented in a parallel manner to a circuit card. The atomizers 102 may be distributed in a one- or two-dimensional array across the spray plate. The location of each atomizer may be custom selected for highest performance, or the atomizers may be arrayed in uniform spaced distances apart. All versions of the laminated array 101 of pressure swirl atomizers are formed from at least 2, and typically 6 or more plates laminated together. Forming the atomizers of plates containing the functional constituents of the atomizers (or portions of the functional constituents) allows for more precise control over the dimensions of the atomizers than would otherwise be possible.

FIGS. 1, 2 and 3 illustrate an example of a sealed housing 50 that is usable with some versions of the invention. The housing 50 encloses a plurality of circuit cards 53 carrying heat producing electronic components 54. As seen particularly in FIGS. 1 and 2, the circuit cards are supported by a rack or tray 105 that is carried by, or integral with, the spray plate 100. The rack provides supporting feet 106 and slots 107 that are sized to support the circuit cards.

In a first embodiment of the invention, the laminated array of pressure swirl atomizers produces atomized liquid droplets 55 of liquid coolant 56 which are sprayed upon the surface of the electronic components 54 to be cooled and are contained completely within the sealed, fluid-tight housing 50. The liquid coolant 55 may be "FC72" coolant such as Fluorinert™, a dielectric cooling fluid manufactured by the 3M Company. The coolant collects in a reservoir 51, typically in a lower area of the housing 50, where it is transported by a coolant supply line 52 to the plenum chamber 103 between the outer wall 104 and the laminated array 101 of the spray plate 100.

Referring to FIGS. 6 through 10, a four layer version 400 of the spray plate 100 is seen. Versions of the invention having four or more layers are typically chemically milled, in a manner similar to printed circuit boards. The use of this number of layers is necessary to maintain geometric tolerances, as the etching process does not "drill" a straight through hole like mechanical drilling; rather the hole tapers from one planar surface to the other. In FIGS. 6–10, a spray plate 100 provides a laminated array 101 and a plenum or fluid chamber 103 having an outer wall 104. The laminated array 101 contains a plurality of atomizers 102 distributed in a manner calculated to be most efficient for the specific application. FIGS. 7–10 illustrate the four layers of the laminated array.

Figure 10:
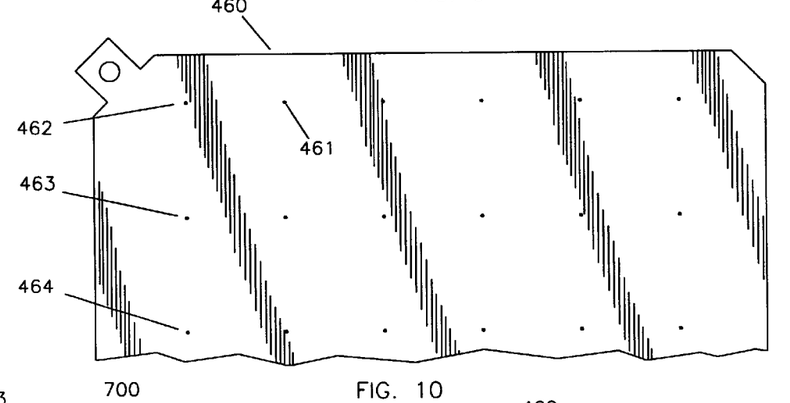
FIG. 10 is a top view of a fourth plate of the laminated pressure swirl atomizer array of the version of the invention of FIG. 6.
Figure 11:
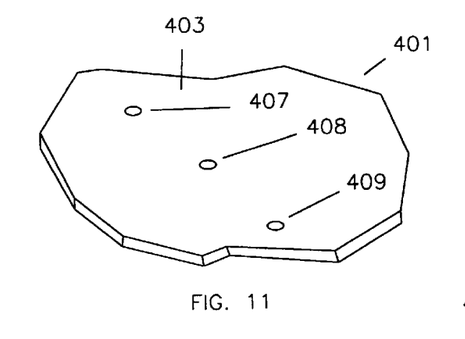
FIG. 11 is an enlarged perspective view of one aperture set in the first plate of FIG. 7.

In a manner that may be custom designed in a fashion that is best suited to the distribution of circuit cards within a particular enclosure, such as that of FIGS. 1–3, the discharge apertures 461 of atomizers 102 are seen in FIG. 10 arrayed in rows 462, 463, 464. To further customize the array of atomizers 102 on the spray plate 100, the spacing between any two atomizers within any row or between any two rows may be selected to achieve the desired spray pattern coverage appropriate for a specific circuit card 53, as seen in FIGS. 2 and 3. It should be noted that rows and columns of atomizers are not required, and that atomizers may be scattered in a manner calculated to best result in their collective atomized sprays providing the maximum cooling benefit.

Figure 6:
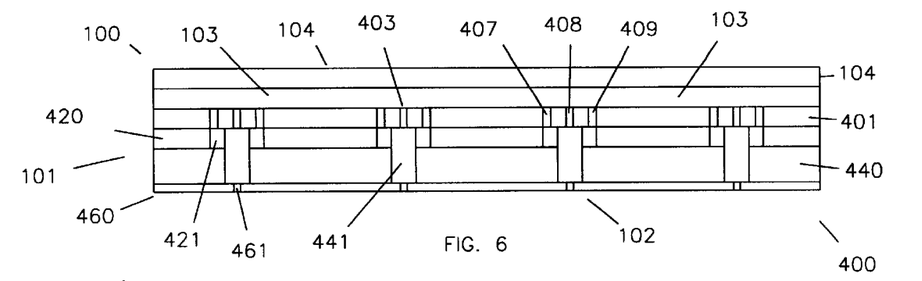
FIG. 6 is a cross-sectional view of a four plate version of the laminated pressure swirl atomizer array of the invention including a cover to form fluid inlet plenum.
Figure 7:
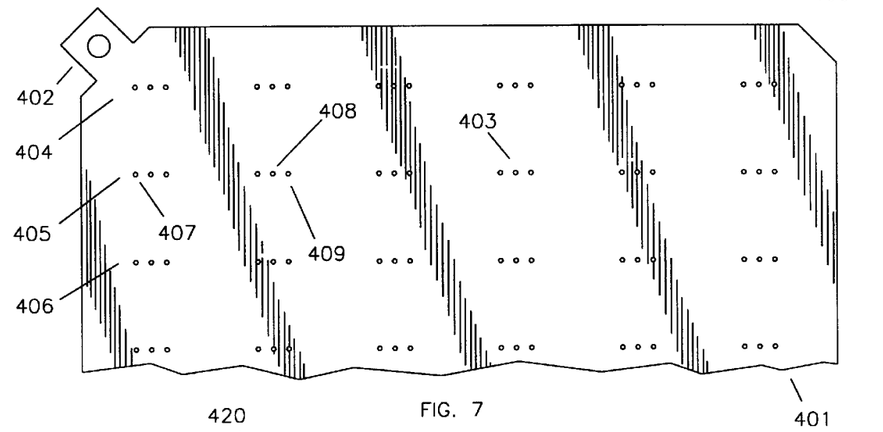
FIG. 7 is a top view of a first plate of the laminated pressure swirl atomizer array of the version of the invention of FIG. 6.

As illustrated in FIGS. 6 and 7, the first plate 401 is on the inlet side of the spray plate 100, in immediate communication with the pressurized liquid coolant 56 contained in the plenum 103, seen in FIG. 6. An alignment key 402 allows the first plate 401 to be aligned with the subsequent plates. Referring specifically to FIGS. 6 and 7, the first plate 401 is typically 0.010 inches thick and includes a plurality of rows of aperture sets 403; in the example of FIG. 7 including rows 404, 405, 406. Each aperture set 403 provides a first and second swirl inlets 407, 409 and a center jet 408. The center jet 408 is optional, and in some applications may not be required. The spacing of the aperture sets 403 of the circular apertures 407, 408, 409 on the first plate 401 is dependent on the desired location of the atomizers 102. The desired location of the atomizers is dependent on the spacing of the component cards 53, as seen in FIG. 1, and/or the component arrangement on each card, as seen in FIGS. 2 and 3.

Figure 8:
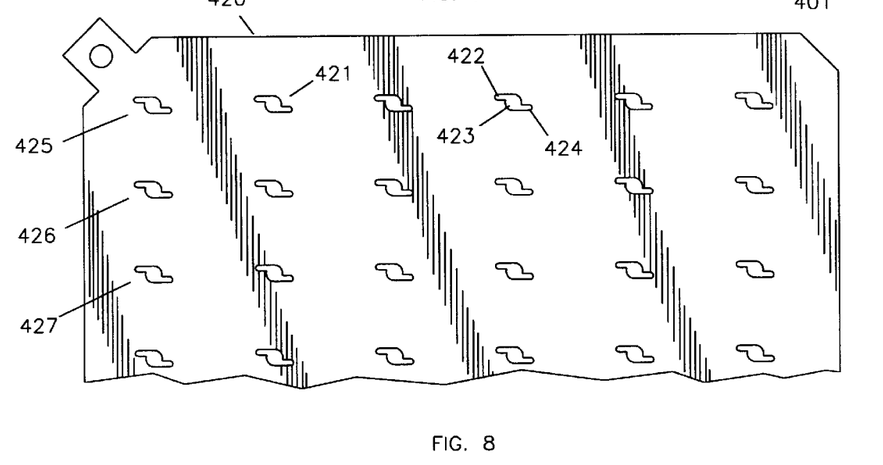
FIG. 8 is a top view of a second plate of the laminated pressure swirl atomizer array of the version of the invention of FIG. 6.

Referring next to FIGS. 6 and 8, the second plate 420 is seen sandwiched between the first plate 401 and the third plate 440. The second plate 420 is typically 0.015 inches thick, and includes an array of swirlers 421, distributed in a number of rows 425, 426, 427, in the example of FIG. 8. Each swirler 421 provides a first swirl feed port 422, an upper portion 423 of the swirl chamber 441, and a second swirl feed port 424.

The spacing of the swirlers 421 on the second plate 420 is dependent on the desired location of the atomizers seen in FIG. 6. An alignment key carried by the second plate causes the aperture sets 403 of the first plate 401 to coincide with the swirlers 421 of the second plate 420. Specifically, each swirler 421 is positioned on the second plate 420 such that the first swirl feed port 422 of each swirler is aligned with a corresponding first swirl inlet 407 of the first plate, in a manner illustrated in FIG. 6. Similarly, the upper portion 423 of each swirl chamber 441 is aligned with a corresponding center jet 408 (if present) of the first plate 401. Finally, the second swirl feed port 424 of each swirler is aligned with a corresponding second swirl inlet 409 of the first plate.

Figure 9:
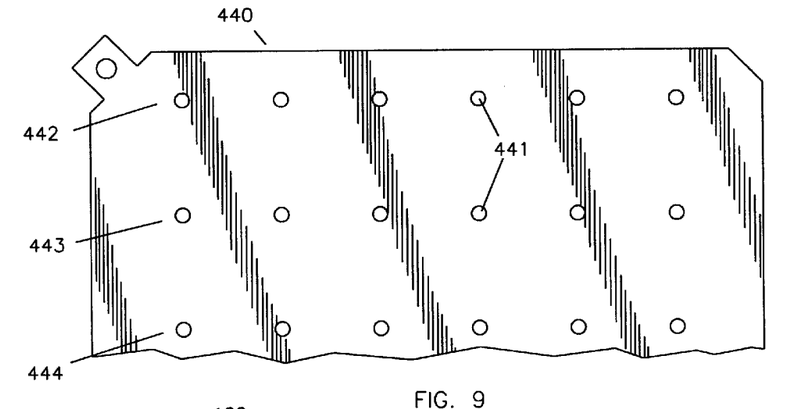
FIG. 9 is a top view of a third plate of the laminated pressure swirl atomizer array of the version of the invention of FIG. 6.

Referring next to FIGS. 6 and 9, the third plate 440 is seen sandwiched between the second plate 420 and the fourth plate 460. The third plate 440 is typically 0.025 inches thick. The third plate typically provides a plurality of rows of swirl chambers 441, represented in the example of FIG. 9 by rows 442, 443, 444. In a manner that is most clearly illustrated in FIG. 6, the spacing of the swirl chambers 441 on the third plate 440 is dependent on the desired location of the atomizers seen in FIG. 6.

Figure 18:
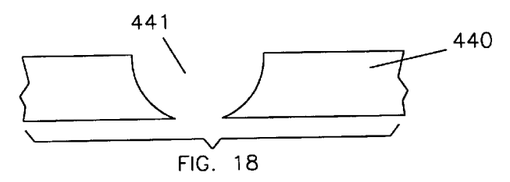
FIG. 18, FIG. 19, and FIG. 20 represent enlarged cross-sectional views of versions of the swirl chamber of FIG. 9.
Figure 19:
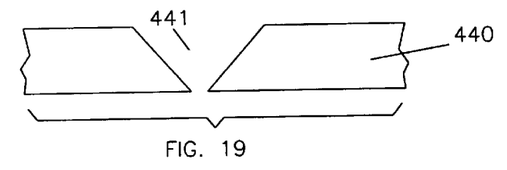
Figure 20:
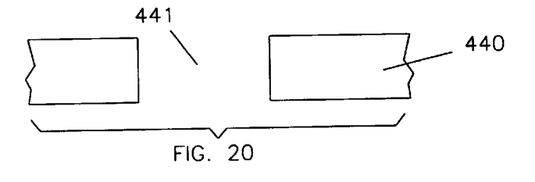

It may be noted that the shape of the bottom of the swirl chamber is not critical. However, it is clear that the swirl chamber must pass completely through the third plate. Referring to FIGS. 18, 19 and 20, it can be seen that the swirl chamber 441 can be hemispherical, conical or cylindrical. Often, manufacturing technique may be used to determine the most cost efficient swirl chamber.

Figure 14:
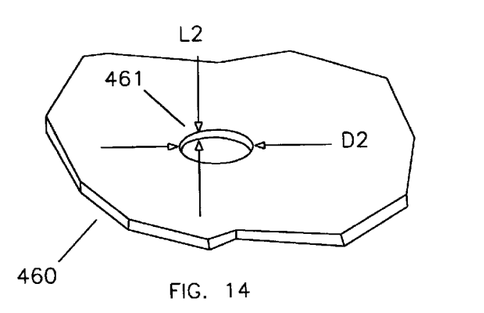
FIG. 14 is an enlarged perspective view of one discharge aperture in the fourth plate of FIG. 10.
Figure 15:
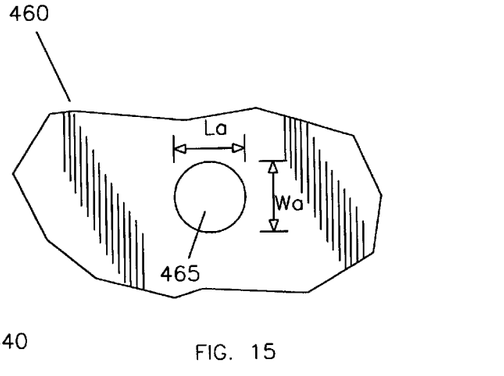
FIG. 15 is an enlarged top view of the discharge port of FIG. 10.
Figure 16:
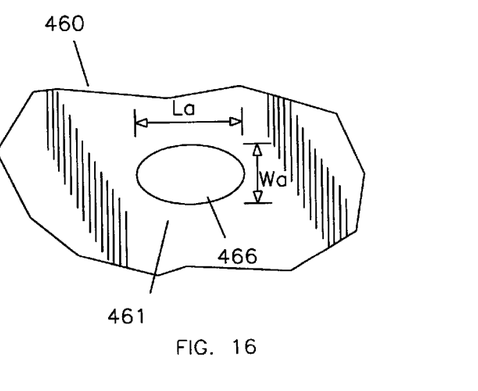
FIG. 16 is an enlarged top view of a discharge port that is an alternative to that seen in FIG. 15.
Figure 17:
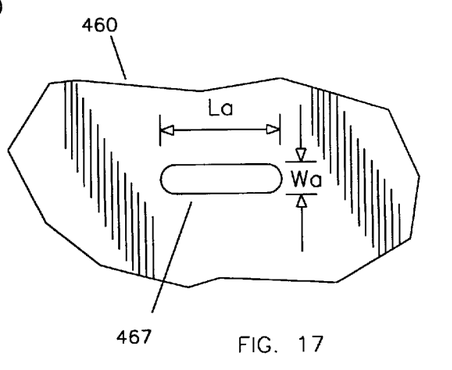
FIG. 17 is an enlarged top view of a discharge port that is an alternative to that seen in FIGS. 15 and 16.

Referring next to FIGS. 6, 10, and 14–17 the fourth plate 460 is seen positioned adjacent to the third plate 440. The fourth plate 460 is typically 0.005 inches thick. This can vary by +/−0.002 to maintain the desired length to diameter ratio of the discharge apertures 461. The fourth plate typically provides rows of discharge apertures, represented in the example of FIG. 10 by rows 462, 463, 464. As seen in FIG. 15, the discharge aperture 461 may be a circular opening 465. Alternatively, as seen in FIG. 16, the discharge aperture may be an elliptical opening 466, or as seen in FIG. 17, the discharge aperture may be a slot having rounded ends 467. In a manner that is most clearly illustrated in FIG. 6, the spacing of the discharge apertures 461 on the fourth plate 460 is dependent on the desired location of the atomizers 102, and must be aligned with an associated swirl chamber 441.

The aperture sets 403, the swirlers 421, the swirl chambers 441 and the discharge apertures 461 may all be manufactured using chemical etching techniques. Other suitable methods of creating the plates containing the atomizer constituents include laser cutting techniques, machining, injection molding and stamping.

After the atomizer constituents required in each plate 401, 420, 440 and 460 are created, the individual plates are laminated together with aperture sets 403 aligned with swirlers 421 and swirl chambers 441, which in turn are aligned over the discharge apertures 461, thereby forming atomizers 102, as seen in FIG. 6.

Figure 4:
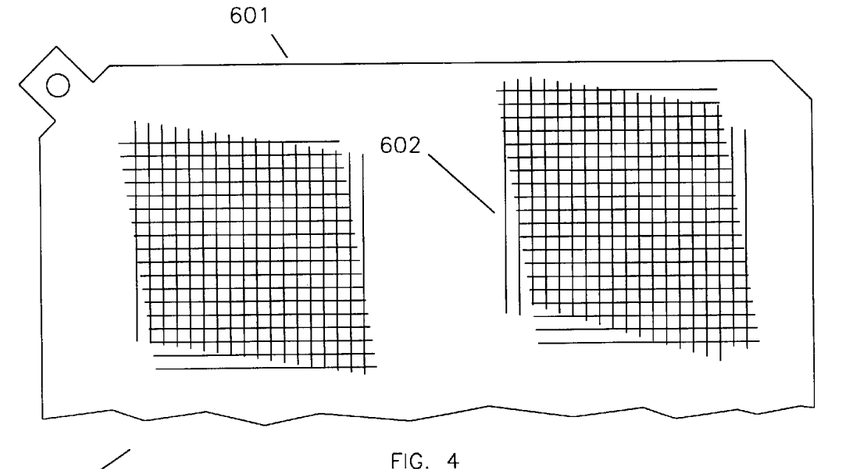
FIG. 4 is a top view of a plate having an inlet filter screen body usable with a version of the invention.
Figure 5:
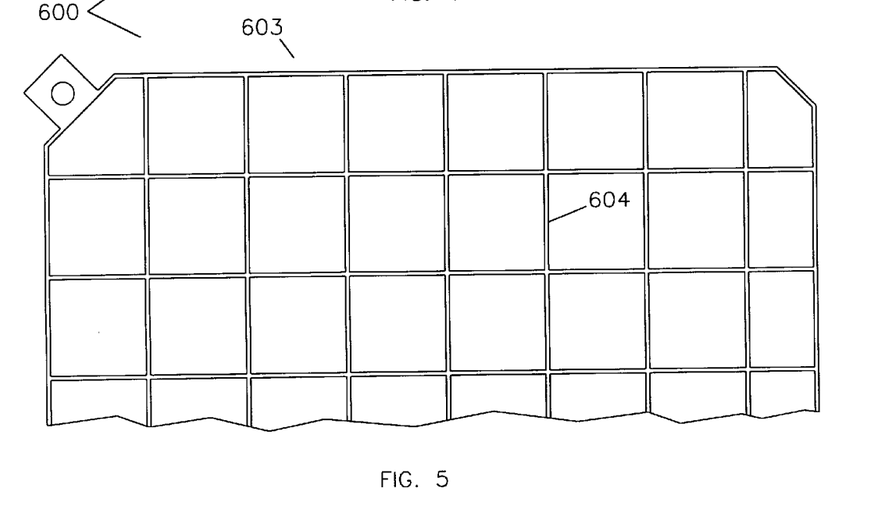
FIG. 5 is a top view of a plate having a matrix of standoffs usable with the plate of FIG. 4.

Any of the plates disclosed may be made from two similar plates laminated together. For example, the swirler plate of FIG. 8 or the swirl chamber plate of FIG. 9 may be made of two similar plates laminated together. The advantage of doing so is that more precise control may be exercised over the dimensions of the constituent elements of the atomizers. This is particularly true where the plates are formed by a chemical etching process, which often does not result in straight sidewalls of the orifices and chambers of the atomizers.

The number of layers in a spray plate is dictated by manufacturing convenience. A milling and molding procedure would generally result in a two layer spray plate. Electro discharge machining (EDM), chemical etching, stamping, laser machining or any combination of these might result in three to eight or more layers.

A second version 600 of the laminated array of pressure swirl atomizers of the invention includes a spray plate 100 comprising two plates which are seen in FIGS. 4 and 5 in addition to the plates 401, 420, 440, 460 previously described. An additional plate 601, adjacent to the plenum 103, provides a screen body 602 which filters the coolant, thereby preventing foreign matter from clogging the atomizers. A plate 603, laminated between plates 601 and the first plate 401, provides a body comprising an array of stand-off elements 604, which prevent the screen 602 from directly contacting the apertures sets 403.

Figure 24:
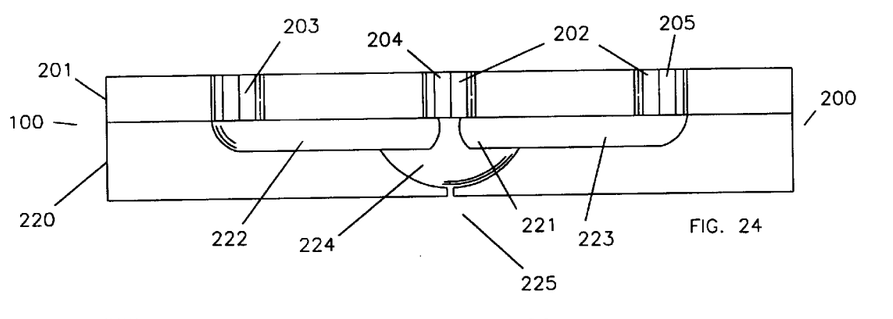
FIG. 24 is an enlarged partial side view section of an atomizer produced by a second embodiment of the laminated pressure swirl array of the invention.
Figure 25:
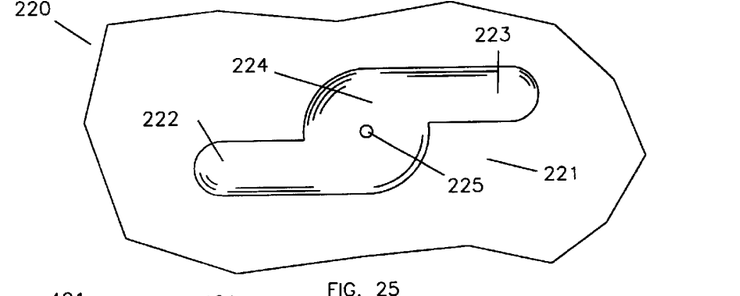
FIG. 25 is an enlarged partial top view of the version of the invention of FIG. 18.

A third version of the laminated array of pressure swirl atomizers of the invention is seen in FIGS. 24 and 25. In this version of the invention, a spray plate 200 provides a first plate 201 laminated to a second plate 220. The first and second plates are typically formed by use of machining or die-press technique.

A first plate 201 is adjacent to the plenum 103, and provides an array of aperture sets 202. The first plate is typically 0.010 inches thick. Each aperture set provides first and second swirl inlets 203, 205 and a center jet 204, all of which pass completely through the first plate. The first plate 201 is very similar to the first plate 401, and typically differs, if at all, in the method of its manufacture.

A second plate 220 is laminated to the first plate 201, and is seen in cross-section in FIG. 24 and in a top view in FIG. 25. The second plate is typically 0.045 inches thick The second plate provides an array of swirlers 221 having first and second swirl feed ports 222, 223, and a swirl chamber 224. A discharge aperture 225 may be round, oval or other shape.

Figure 34:
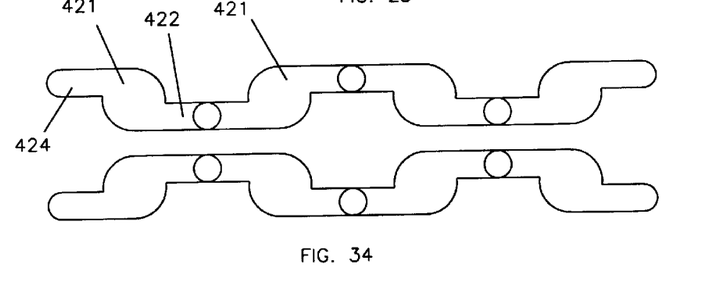
FIG. 34 illustrates how, in one version of the invention, the swirl feed ports of adjacent swirlers in a swirler plate may share swirl inlets in an adjacent aperture set plate.

As seen in FIG. 34, where atomizers are packed in a relatively dense array, the swirl feed ports 422, 424 of adjacent swirlers 421 may share swirl inlets 407, 409. This allows the plate 401 containing aperture sets 403 to be less complex, and therefore less expensive.

Figure 13A:
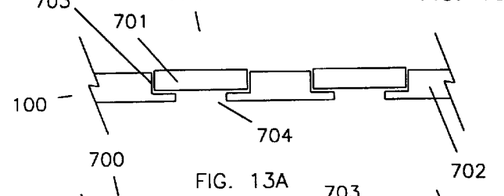
FIGS. 13A and 13B show a further version of the invention wherein a spray plate comprises discrete laminated arrays of atomizers carried by a supporting plate.
Figure 13B:
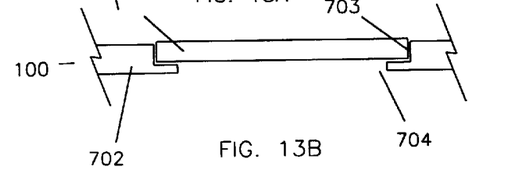

Referring to FIGS. 13A and 13B, a version 700 of the invention having a spray plate 100 comprising a support plate 702 with sockets 703 and associated spray clearance holes 704 carrying discrete laminated arrays 701 of atomizers is shown. The discrete laminated arrays 701 may be formed in a manner similar to those of the four layer version 400 of the invention, or in any other manner herein disclosed. The laminated arrays may include one or more atomizers. After separating the laminated array from a laminated plate constructed in accordance to any of the above techniques, the laminated array is glued or otherwise fastened to the support plate 702. A fluid plenum or chamber (not shown) and outer wall would also be included in this version of the spray plate.

In any version of the invention, two or more similar layers may replace one layer where the manufacture of multiple layers laminated together provide better geometric tolerances.

Also, in any version of the invention, the spray plates and laminated arrays do not have to be planar. In some applications complex surface geometries may be used advantageously. These geometries may include cone or spherical surfaces, or irregular surfaces that are determined by the application.

Additionally, the disclosed spray plate may be used with a number of industrial processes in addition to electronics cooling, such processes may include quenching, etching, washing and many others.

Referring to the FIGS. 12–14, 21–23 and 26–31, the various design parameters for the atomizer constituents in the spray plate 100 are illustrated. In constructing a spray plate 100 that is customized in a manner that is best suited for any specific application, it is necessary to design an array of atomizers 102 located in the most advantageous locations. Additionally, it is important that the nozzles so located have the most desirable spray pattern characteristics. The spray pattern characteristics should be chosen to reflect that specific job of each spray atomizer 102. The spray pattern characteristics are dependent on the relative sizes and shapes of the atomizer components. The below design guidelines relate the structural characteristics of the atomizer to the spray pattern characteristics in the circumstance that the discharge aperture 465 is round, as seen in FIGS. 14 and 15. The below design guidelines therefore relate to a method of controlling the spray pattern characteristics by varying the structural characteristics of the constituent parts of an atomizer, thereby allowing each of the atomizers to be further customized for the specific duty of each atomizer in the application. As such, the below design guidelines are an aid in the construction of a more efficient spray plate 100 for any given circuit card, array of circuit cards or other application.

Figure 21:
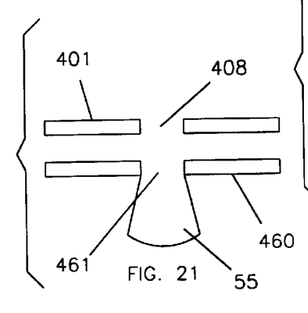
FIG. 21 is a diagrammatic partial side view of an atomizer of the present invention illustrating the relationship between the center jet diameter, the discharge aperture diameter and the resulting spray cone pattern.

1. Where the cross-sectional area of the center jet 408 is approximately equal to the area of the discharge aperture 461, a full or filled spray cone pattern with a spray cone angle of 30 to 45 degrees will result, as seen in FIG. 21.

Figure 22:
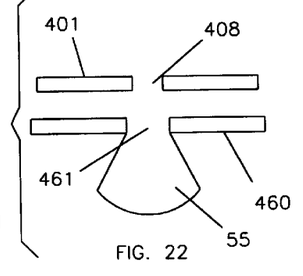
FIG. 22 is a diagrammatic partial side view of an atomizer of the present invention illustrating the relationship between the center jet diameter, the discharge aperture diameter and the resulting spray cone pattern.

2. Where the cross-sectional area of the center jet 408 is approximately 90% +/−2% of the area of the discharge aperture 461, a full spray cone having an angle of greater than 45 degrees will result, as seen in FIG. 22.

Figure 23:
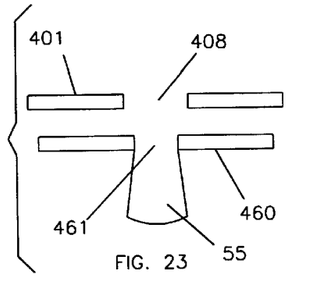
FIG. 23 is a diagrammatic partial side view of an atomizer of the present invention illustrating the relationship between the center jet diameter, the discharge aperture diameter and the resulting spray cone pattern.

3. Where the cross-sectional area of the center jet 408 is approximately 110% +/−2% of the area of the discharge aperture 461, a full spray cone having an angle of less than 30 degrees will result, as seen in FIG. 23.

4. The cross-sectional area of the swirl chamber 441 should generally be three to seven times greater than the area of the total cross-sectional area of the swirl feed ports 422, 424. The smaller ratio is chosen for coarser atomization, the larger ratio is chosen for finer atomization.

5. The swirl feed port length is approximately twice its hydraulic diameter.

Figure 12:
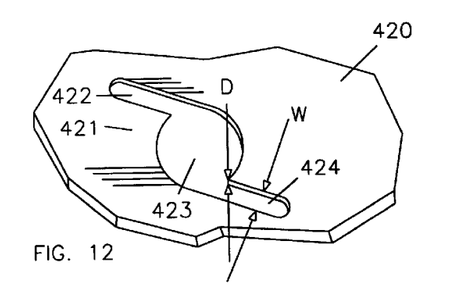
FIG. 12 is an enlarged perspective view of one swirl chamber in the second plate of FIG. 7, illustrating the relationship between the depth and the width of each swirl feed port of the swirl chamber.

6. The depth D of each swirl feed port 422, 424 is approximately ¾ of its width W, as seen in FIG. 12.

7. The length L2 of the depth of the discharge aperture 461 is preferably less than ⅔ the (hydraulic) diameter D2 of the discharge aperture, as seen in FIG. 14.

In constructing a spray plate 100 that is best suited for any specific application, it may be desirable to use non-circular discharge apertures 461, such as those seen in FIGS. 16 and 17. Non-circular discharge apertures produce elliptical or quasi-elliptical spray pattern characteristics. The aperture may be an elliptical opening 466, as seen in FIG. 16, or a round-ended slot 467, as seen in FIG. 17. An elliptical aperture typically will produce a more uniform droplet pattern than will an aperture in the form of a round ended slot. Either an elliptical discharge aperture or a round ended slot discharge aperture may be preferable, depending on the spray pattern characteristics required. The below design guidelines relate the characteristics of the atomizer nozzles to the spray pattern characteristics in the circumstance that the discharge aperture 461 is non-circular. The below design guidelines therefore relate to a method of controlling the spray pattern characteristics by varying the structural characteristics of the constituent parts of an atomizer having a non-round discharge aperture 461. The design guidelines are therefore an aid in the construction of an efficient spray plate 100.

Figure 26:
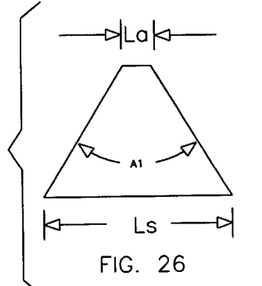
FIG. 26 is a top view of a spray cone pattern illustrating the relationship between the width and length of an elliptical discharge aperture and the spray pattern produced.
Figure 27:
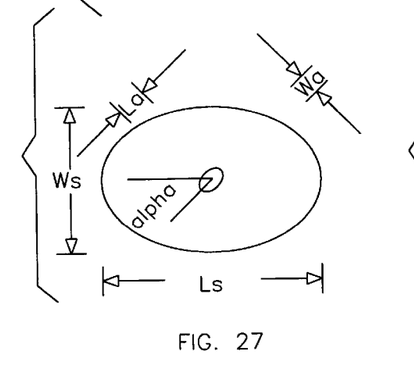
FIG. 27 is a front view of a spray cone pattern illustrating the relationship between the width and length of an elliptical discharge aperture and the spray pattern produced.
Figure 28:
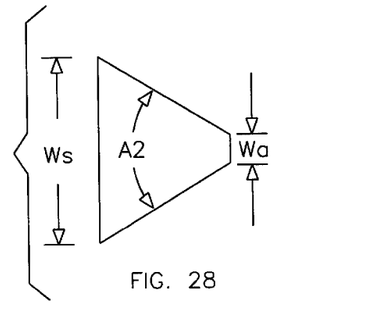
FIG. 28 is a side view of a spray cone pattern illustrating the relationship between the width and length of an elliptical discharge aperture and the spray pattern produced.
Figure 29A:
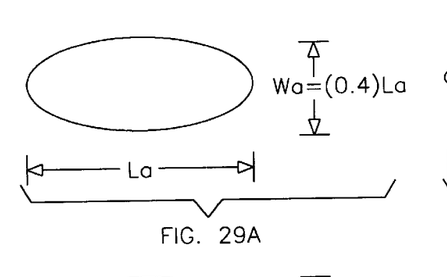
FIGS. 29A and 29B are front views of the elliptical discharge aperture and spray cone pattern of FIG. 27, further illustrating the relationship between the width and length of the discharge aperture and the spray pattern.
Figure 29B:
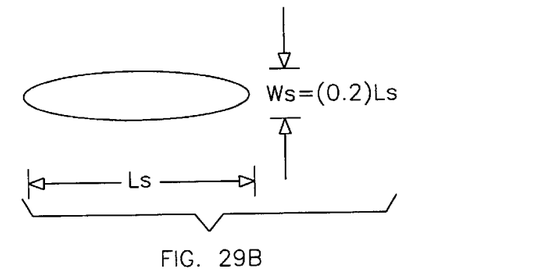
Figure 30A:
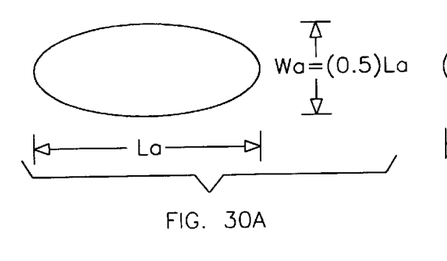
FIGS. 30A and 30B are front views of the elliptical discharge aperture and spray cone pattern of FIG. 27, further illustrating the relationship between the width and length of the discharge aperture and the spray pattern.
Figure 30B:
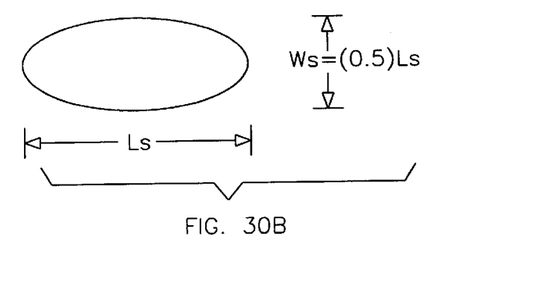

As seen in FIGS. 26, 27 and 28, in an elliptical spray pattern, there is a major axis spray cone angle A1 and a minor axis spray cone angle A2. The design parameters discussed above with regard to circular discharge apertures apply to the major axis spray cone angle A1 in the circumstance of a non-circular discharge aperture 461. For any discharge aperture, the ratio of the minor axis spray cone angle to the major axis spray cone angle (A2/A1) is approximately proportional to the ratio of the aperture width Wa to the aperture length La. In a circular aperture, the width equals the length; therefore, Wa/La=1, and the minor axis and major axis spray cone angles are equal. However, the ratio of the minor axis spray cone angle to the major axis spray cone angle, A2/A1, for a non-circular discharge aperture, and the ratio of the aperture width to the aperture length, Wa/La, is not directly proportional to the spray pattern ratio A2/A1. For example, as seen in FIGS. 29A and 29B, for a Wa/La of 0.4, the minor/major spray pattern ratio A2/A1 is about 0.2. And as seen in FIGS. 30A and 30B, where the major/minor ratio is 0.5, the major/minor spray pattern ratio A2/A1 is about 0.5.

Note that A2/A1 is the same as Ws/Ls of the spray patterns seen in FIGS. 29A, 29B, 30A and 30B.

Figure 31:
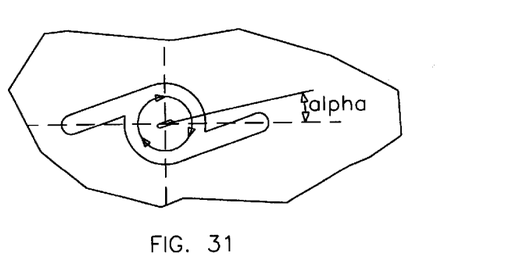
FIG. 31 is a diagrammatic top view of the swirl chamber of the atomizer of FIGS. 12 and 13 and the spray cone pattern of FIG. 27, further illustrating the preferred orientation of the longitudinal axis of the swirl chamber in relation to the longitudinal axis of the elliptical spray pattern.
Figure 32:
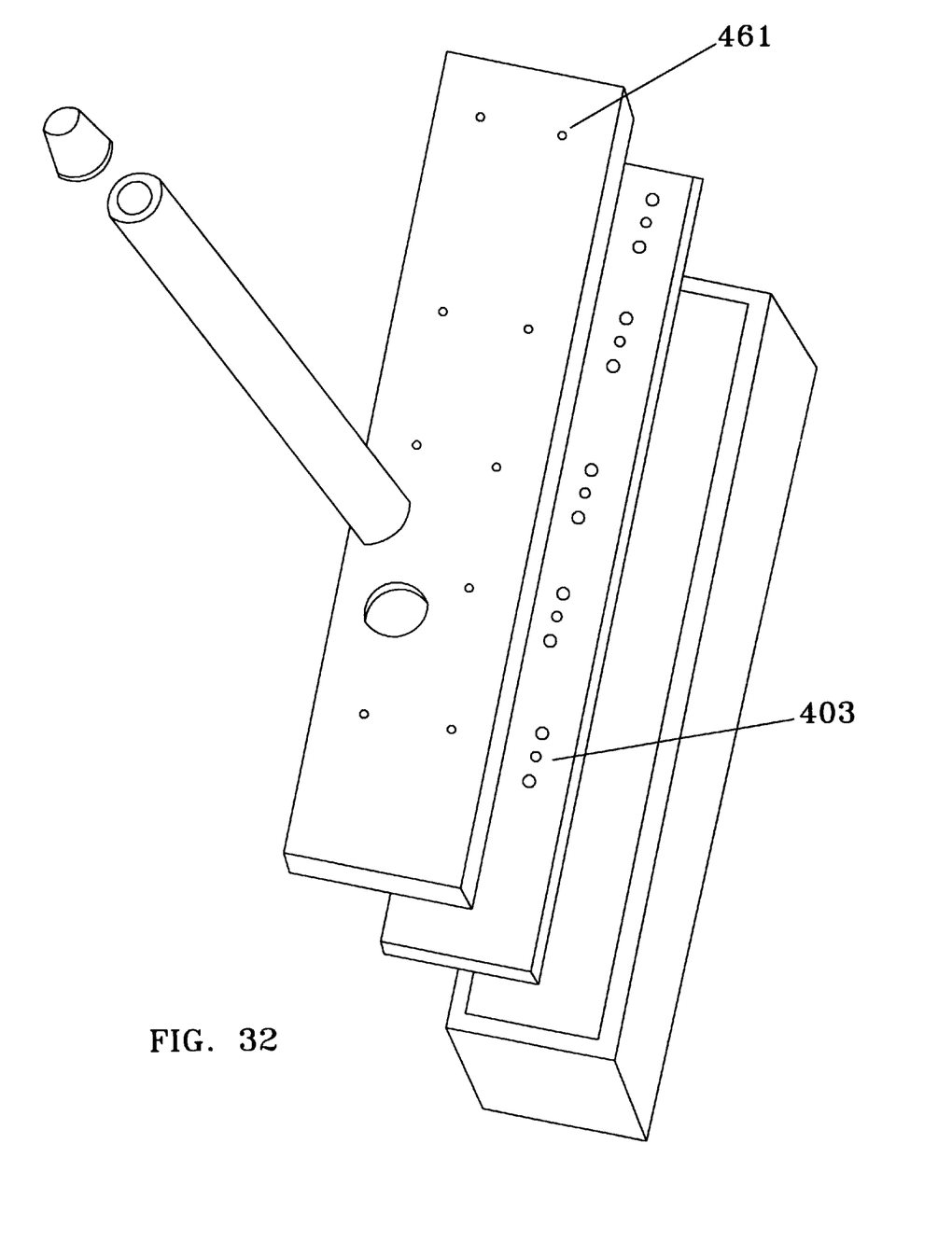
FIG. 32 is a perspective view of a modular version of the invention, wherein a laminated array of pressure swirl atomizers maybe carried by a supporting structure which may be snapped into a supporting spray plate.
Figure 33:
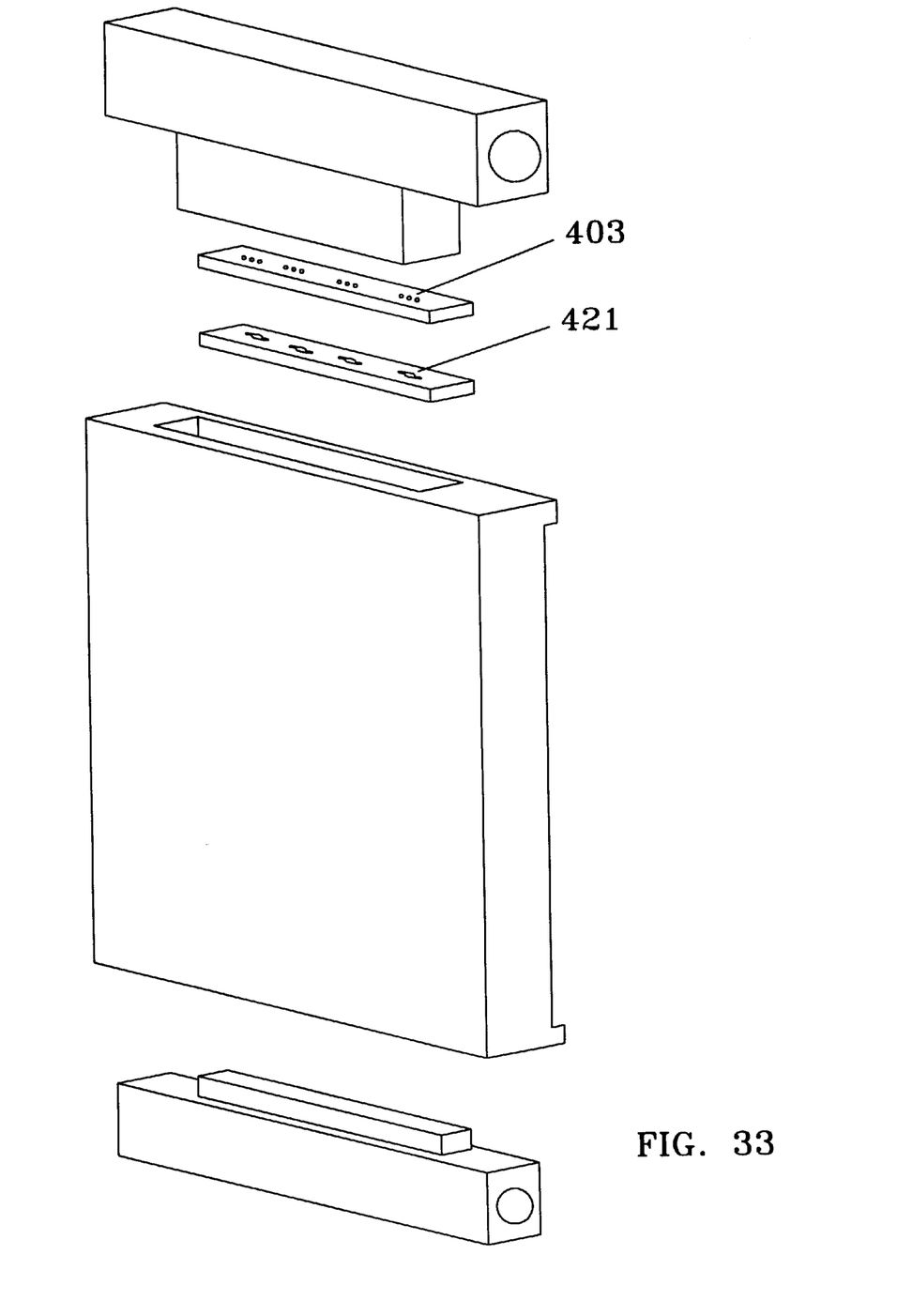
FIG. 33 is a perspective view of a further modular version of the invention, wherein a laminated array of pressure swirl atomizers is carried by a further example of a supporting structure.

As illustrated in FIGS. 27 and 31, the major axis of the spray cone pattern will be displaced by an angle alpha, which is approximately 10 to 20 degrees from an axis passing parallel to the longitudinal axis of the swirl chamber nozzles and through the discharge aperture. The displacement of the spray pattern is due to the angular velocity component imposed on the liquid by the swirlers.

In compliance with the U.S. Patent Laws, the invention has been described in language more or less specific as to methodical features. The invention is not, however, limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of controlling the spray pattern characteristics of coolant flowing from a fluid chamber through a laminated array of atomizers, the method comprising the step of:

(A) selecting the size of each center jet of an aperture set in a plate having an array of aperture sets, wherein the array of aperture sets are adjacent to a fluid chamber and an array of swirlers;

(B) selecting the size of each discharge aperture in a plate having an array of discharge apertures; and (C) assembling an array of atomizers by laminating together at least two plates, each plate providing an array of functional constituents of the atomizers.

2. The method of claim 1, the method comprising the additional step of:

(A) sizing the cross-sectional area of each swirl chamber contained within an array of swirl chambers on a plate to be between three to seven times greater than the combined cross-sectional area of each pair of swirl feed ports contained within the array of swirlers.

3. The method of claim 2, the method comprising the additional step of:

(A) sizing the swirl feed port's length to be approximately twice the swirl feed port's hydraulic diameter.

4. The method of claim 2, the method comprising the additional step of:

(A) sizing the depth of each swirl feed port of the swirler to approximately ¾ of the width of the swirl feed port.

5. The method of claim 1 comprising the additional step of:

(A) sizing the length of the depth of the discharge aperture to less than ⅔ the diameter of the discharge aperture.

* * * * *